United States Patent [19]
Norton

[11] Patent Number: 5,149,956
[45] Date of Patent: Sep. 22, 1992

[54] TWO-COLOR RADIATION DETECTOR ARRAY AND METHODS OF FABRICATING SAME

[75] Inventor: Paul R. Norton, Santa Barbara, Calif.

[73] Assignee: Santa Barbara Research Center, Goleta, Calif.

[21] Appl. No.: 715,086

[22] Filed: Jun. 12, 1991

[51] Int. Cl.⁵ .............................................. H01J 40/14
[52] U.S. Cl. ................................ 250/211 J; 250/226; 357/30
[58] Field of Search ................ 250/211 J, 211 R, 226; 357/30 B, 30 H, 30 L, 30 Q, 30 R, 16, 32

[56] References Cited

U.S. PATENT DOCUMENTS

| | | | |
|---|---|---|---|
| 4,507,674 | 3/1985 | Gaalema | 357/32 |
| 4,753,684 | 6/1988 | Ondris et al. | 136/258 |
| 4,847,489 | 7/1989 | Deitrich | 250/226 |
| 4,885,619 | 12/1989 | Kosai | 357/24 |
| 4,961,098 | 10/1990 | Rasbeck et al. | 357/30 |
| 5,001,532 | 3/1991 | Petroff | 357/30 |

Primary Examiner—David C. Nelms
Assistant Examiner—S. Allen
Attorney, Agent, or Firm—W. C. Schubert; W. K. Denson-Low

[57] ABSTRACT

Methods of fabricating a two-color infrared detector array, and an array of same fabricated by the methods. There is disclosed (a) selectively forming a plurality of first regions upon or within a surface of a substrate, the first regions being comprised of a first semiconductor material having a first type of electrical conductivity and a significant responsivity to wavelengths within a first spectral band. A second step (b) forms a substantially continuous layer comprised of a second semiconductor material over the surface of the substrate and over the plurality of first regions, the layer being comprised of semiconductor material having a second type of electrical conductivity for forming a plurality of first heterojunctions with the first regions. A third step (c) selectively forms a plurality of second regions upon the layer, individual ones of which are in registration with a corresponding one of the first regions. The second regions are comprised of a semiconductor material having the first type of electrical conductivity for forming a plurality of second heterojunctions with the underlying layer and a significant responsivity to wavelengths within a spectral band that does not significantly overlap the first spectral band.

21 Claims, 3 Drawing Sheets

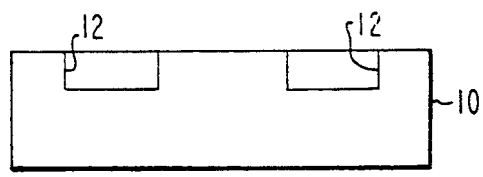
Fig. 1a.
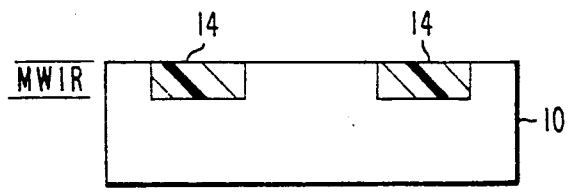
Fig. 1b.
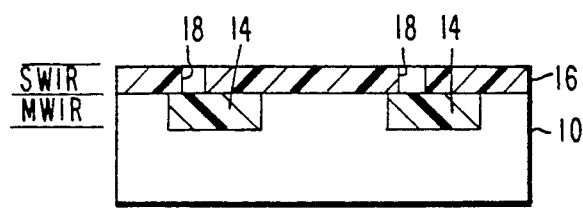
Fig. 1c.
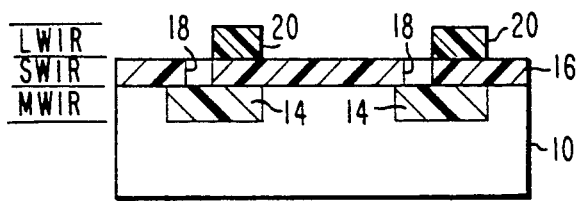
Fig. 1d.
Fig. 2a.    Fig. 2b.
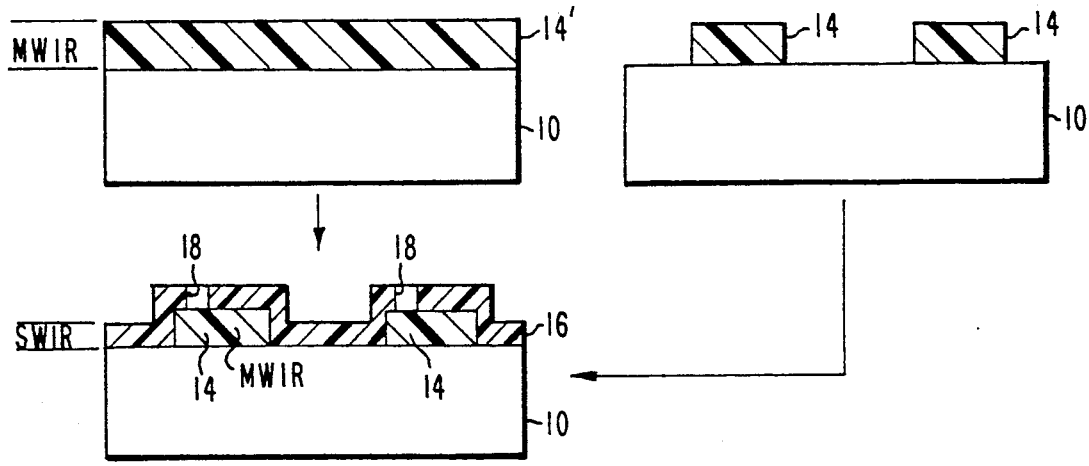
Fig. 2c.

TWO-COLOR RADIATION DETECTOR ARRAY AND METHODS OF FABRICATING SAME

FIELD OF THE INVENTION

This invention relates generally to methods of fabricating semiconductor radiation detectors and, in particular, to a method of fabricating a semiconductor radiation detector that is simultaneously responsive to radiation within two spectral bands, or "colors".

BACKGROUND OF THE INVENTION

A desirable photodetector is a two-color infrared detector having simultaneous sensitivity in two spectral bands. An array of same may be employed in a number of imaging applications wherein it is required to simultaneously detect radiation within two spectral bands that emanates from a scene within a field of view of the array.

In commonly assigned U.S. Pat. No. 4,885,619, Dec. 5, 1989, entitled "HGCDTE MIS Device Having a CDTE Heterojunction" K. Kosai discloses a metal-insulated-semiconductor device comprised of Group II-VI material.

In U.S. Pat. No. 4,847,489, Jul. 11, 1989, entitled "Light Sensitive Superlattice Detector Arrangement with Spectral Sensitivity" Dietrich discloses a detector arrangement comprising a plurality of photosensitive detector elements each of which has a multilayer structure of alternating positively and negatively doped photosensitive semiconductor material having a superlattice structure. A control voltage is said to control spectral light sensitivity and an optical filter arrangement is provided for dividing the photodetectors into an upper and lower effective spectral range group.

In U.S. Pat. No. 4,753,684, Jun. 28, 1988, "Photovoltaic Heterojunction Structures" Ondris et al. describe a three layer, double heterojunction Group II-VI photovoltaic structure that employs a minority current mirror.

In Japanese Patent No. 55-101832, Aug. 4, 1980, Makoto Itou discloses, in the Abstract, an infrared detector comprised of n-type HgCdTe having electrodes 2 and 3 arranged on opposite surfaces. A polarity of a biased voltage is switchably coupled to the electrodes 2 and 3. This device is said to enable rays of wide wavelength ranges to be detected by only one semiconductor detector.

An article entitled "Some Properties of Photovoltaic $Cd_xHg_{l-x}Te$ Detectors for Infrared Radiation", by J. M. Pawlikowski and P. Becla, Infrared Physics, Vol. 15 (1975) pp. 331-337 describes photovoltaic p-n junction detectors constructed of HgCdTe crystals and epitaxial films.

Its authors report that the position of a photosensitivity maximum is shifted within a spectral region of 1-9 microns by changing a molar fraction of cadmium.

In commonly assigned U.S. patent application Ser. No. 07/452,891, filed Dec. 19, 1989, entitled "Two Terminal Multi-Band Infrared Radiation Detector" Eric F. Schulte discloses embodiments of two-color radiation detectors. A bias source is switchably coupled to the detector for enabling first one and then another spectral band to be detected.

It is an object of this invention to provide a method of fabricating a two-color infrared radiation detector array that provides for an efficient use of detector surface area while obtaining enhanced device electrical and optical characteristics.

It is a further object of the invention to provide an array comprised of a plurality of three-layer n-p-n or p-n-p photodetector structures in which a middle, electrically common layer is electrically and physically continuous across the array, and wherein the top and bottom layers are each comprised of an alloy semiconductor having constituents selected for providing the top and bottom layers with a sensitivity to different spectral bands.

It is a still further object of the invention to provide a radiation detector array that enables simultaneous detection of radiation within two spectral bands.

SUMMARY OF THE INVENTION

An object of the invention is realized by a method of fabricating upon a common substrate a plurality of two-color infrared detectors each of which has simultaneous sensitivity in two spectral bands Other objects of the invention are realized by an array of two-color photodetectors constructed in accordance with the method.

A two-color detector fabricated in accordance with the invention includes a three-layer epitaxial structure comprised of n-p-n or p-n-p back-to-back photodiodes. The photodiodes are comprised of an alloy semiconductor, such as HgCdTe, in which the alloy composition of the first and third layers defines the spectral sensitivity for absorbing first and second spectral bands, respectively.

In accordance with the invention a first epitaxial layer is selectively grown or otherwise provided adjacent to a surface of a substrate. For a back-side illuminated device the substrate is selected to be substantially transparent to wavelengths within the two spectral bands of interest. One suitable substrate material is CdZnTe. The wavelength selective areas of the first epitaxial layer are defined, in one embodiment of the invention, by "moats" or "wells" that are etched below the surface of the substrate and within which the first layer is epitaxially grown. Alternatively, the first layer is epitaxially grown upon the top surface of the substrate either selectively or uniformly. If uniformly grown a subsequent etching step defines the individual discrete regions prior to the growth of the second and third layers.

In accordance with the invention there is provided an array comprised of a plurality of three-layer n-p-n or p-n-p photovoltaic detectors in which a middle, electrically common layer is electrically and physically continuous across the array. For each detector, top and bottom epitaxial regions or layers are comprised of an alloy semiconductor having constituents selected for providing the top and bottom layers with a sensitivity to different spectral bands. The top and bottom epitaxial layers associated with each detector are disconnected from adjacent detector elements in the array. The top and bottom layers are further each connected to respective contact pads, the contact pads preferably being provided with indium bumps or functionally equivalent structure for coupling to readout circuitry. This arrangement beneficially provides for the simultaneous detection of radiation within different spectral bands.

A feature of the method of the invention is that its use simplifies the fabrication of the structure by defining the geometry of the first layer prior to depositing the second layer. This beneficially results in a minimal amount of unused area for the top and bottom detector layers while providing for the middle, common contact layer to be interconnected to all of the photodetectors of the array.

BRIEF DESCRIPTION OF THE DRAWING

The above set forth and other features of the invention are made more apparent in the ensuing Detailed Description of the Invention when read in conjunction with the attached Drawing, wherein:

FIGS. 1a-1e show in cross section, not to scale, a two-color photodetector fabricated in accordance with steps of a method of the invention;

FIGS. 2a-2c show in cross section, not to scale, alternate steps of the method, prior to the step of FIG. 1d;

DETAILED DESCRIPTION OF THE INVENTION

Figure 3:
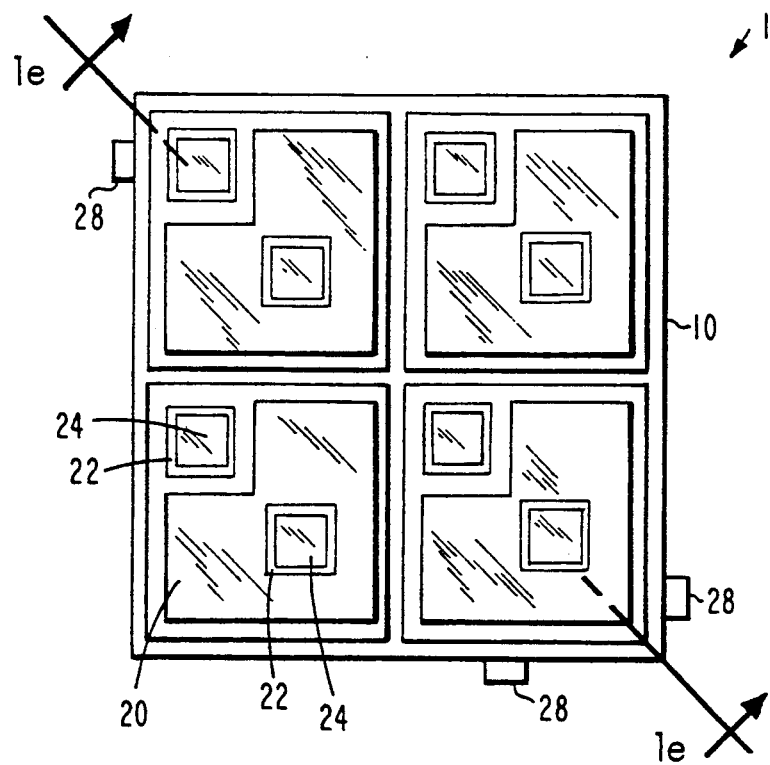
FIG. 3 is a top view, not to scale, showing a two-color photodetector array fabricated in accordance with the method of the invention.

Referring first to FIGS. 1a-1e there is illustrated in cross section, not to scale, steps of a method of the invention for fabricating a two-color photodetector array 1. Although the array is depicted as a two-by-two square array, as seen in FIG. 3, it should be realized that the teaching of the invention extends to other array configurations, such as linear arrays, and to arrays comprised of more or less than four detector sites.

In FIG. 1a an electrically insulating substrate 10 is provided having moats or wells 12 etched into a first major surface thereof, referred to herein for convenience as an "upper" surface. The substrate has a typical thickness of 500 micrometers and is comprised of a material, such as CdZnTe, that is substantially transparent to radiation having wavelengths of interest. Each well 12 is formed at a location wherein it is desired to fabricate an individual two-color photodetector. Each of the wells has a typical width of approximately 40 micrometers and a depth of approximately 10 micrometers. A photolithographic technique is employed to define the well 12 positions upon the substrate 10 surface, with a subsequent etching step being used to remove the substrate 10 material. A bromine wet etch is one suitable etching technique.

FIG. 1b shows that each of the wells 12 is filled with a first semiconductor material 14 selected for absorbing a first wavelength band of interest. For the illustrated embodiment the first wavelength band is MWIR.

As used herein SWIR radiation is considered to include a spectral region extending from approximately 1000 nm to approximately 4000 nm. MWIR radiation is considered to include a spectral region extending from approximately 3000 nm to approximately 8000 nm and LWIR radiation is considered to include a spectral region extending from approximately 7000 nm to approximately 14,000 nm. VLWIR radiation is considered to include a spectral region extending from approximately 12,000 nm to approximately 20,000 nm. Although the bands overlap to some extent, for the purposes disclosed herein the overlap is not considered to be significant. Also, as employed herein a semiconductor material is considered to exhibit significant responsivity to a given spectral band if the semiconductor material exhibits a maximum or substantially maximum photosensitivity to wavelengths within the given spectral band.

Material 14 is comprised of epitaxial $Hg_{l-x}Cd_xTe$ wherein x is selected for providing absorption of MWIR radiation and is made n-type in order to function as a portion of a photodiode, as will be described. By example, n-type MWIR responsive material 14 is comprised of $Hg_{0.7}Cd_{0.3}Te$ having a thickness comparable to the depth of the well 12, or approximately 10 micrometers. Material 14 is doped with a donor species such as indium at a concentration of approximately $2 \times 10^{15}$ cm$^{-3}$.

The well 12 is preferably filled with the MWIR material 14 through an epitaxial deposition process, such as vapor phase epitaxy (VPE), liquid phase epitaxy (LPE), or chemical vapor deposition (CVD). After filling the wells 12 excess MWIR material is removed through a planarization process and the upper surface of the substrate 10 is prepared to accomplish a subsequent deposition step.

Referring to FIG. 1c this subsequent deposition step is shown to provide a substantially uniform epitaxial layer 16 comprised of SWIR semiconductor material. The SWIR material of layer 16 is also comprised of $Hg_{l-x}Cd_xTe$ wherein x is selected for providing absorption of SWIR radiation. The SWIR material is made p-type in order to form a plurality of first heterojunctions 14a with the underlying n-type material 14. By example, p-type SWIR responsive layer 16 is comprised of $Hg_{0.6}Cd_{0.4}Te$ having a thickness of approximately 3000 nm and is doped with an acceptor species such as arsenic at a concentration of approximately $1 \times 10^{17}$ cm$^{-3}$. The layer 16 may also be provided by an LPE, VPE or CVD process.

Openings 18 are formed in the SWIR layer 16 in order to provide for a subsequently formed electrical contact to the underlying MWIR material 14. The openings 18 may be etched through the layer 16 or the desired regions may be selectively masked before the deposition of the layer 16, the masking material subsequently removed by a lift-off process to form the openings 18.

FIG. 1d shows a plurality of LWIR regions 20 that are formed upon the SWIR layer 16 in registration with the underlying MWIR material 14. The LWIR material is also comprised of $Hg_{l-x}Cd_xTe$ wherein x is selected for providing absorption of LWIR radiation. The LWIR material is made n-type for forming a plurality of second heterojunctions 20a with the underlying p-type SWIR material of layer 16. By example, the n-type LWIR responsive regions 20 are comprised of $Hg_{0.8}Cd_{0.2}Te$ having a thickness of approximately 10 micrometers doped with a donor species such as indium at a concentration of approximately $2 \times 10^{15}$ cm$^{-3}$. LWIR regions 20 are formed by a photolithographic process that includes depositing a patterned mask over the layer 16 and depositing the LWIR material within openings within the mask, the LWIR material being deposited by an epitaxial deposition process such as LPE, VPE or CVD.

Alternatively, the openings 18 may be etched, either selectively or uniformily, after a LWIR-responsive layer is deposited, masked and selectively removed to form the LWIR regions 20.

In accordance with an aspect of the invention the MWIR material 14 and the LWIR material 20 are provided with the same type of electrical conductivity, either n-type or p-type, and the intervening SWIR layer 16 is provided with the opposite type of electrical conductivity. The resulting structure forms, for each photodetector element or pixel, two back-to-back photodiodes, having an n-p-n or p-n-p configuration.

It is important to note that the MWIR material 14 within each of the wells 12 is isolated from all other MWIR material regions. Similarly, the LWIR regions 20 are physically isolated from one another. However, the SWIR layer 16 is substantially contiguous across the array 1 of devices and thus provides a common electrical contact to each of the photodetectors of the array 1. The substantially uniform layer 16 is only broken at relatively small regions where the openings 18 are provided. This common contact beneficially enables the simultaneous operation of each of the back-to-back photodiodes and the simultaneous detection of radiation within two spectral bands. The photodiodes may be operated with zero bias or with some degree of reverse bias potential.

Figure 1E:
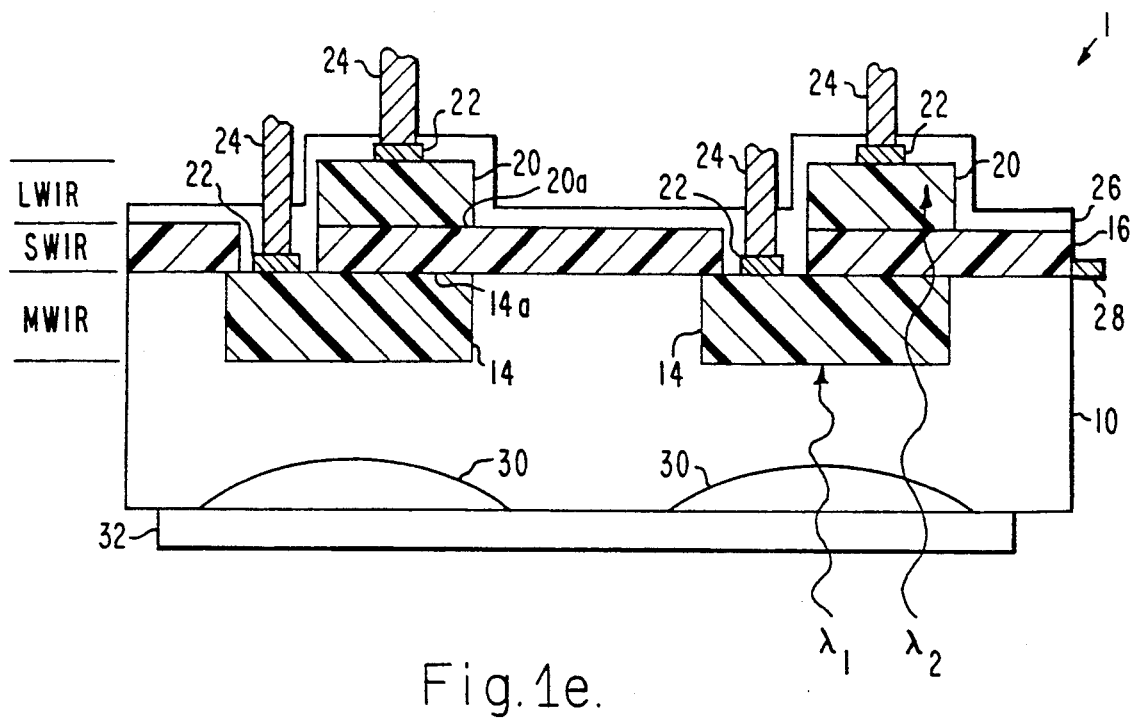
Figure 4:
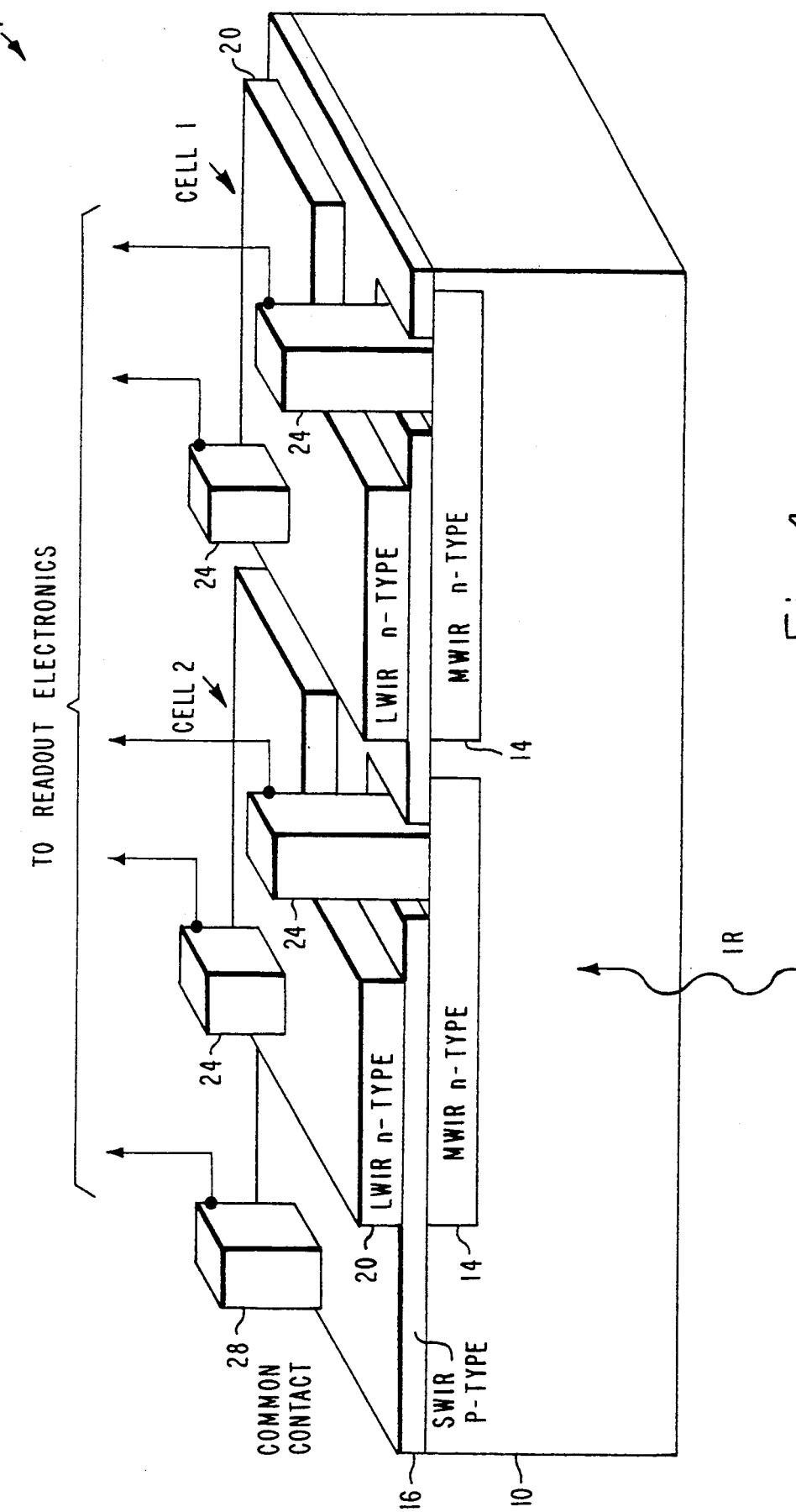
FIG. 4 is an elevational view, not to scale, of the two-color radiation detector array fabricated in accordance with the invention.

Referring now to FIG. 1e and FIG. 4 there is shown a completed array 1 after the performance of additional processing steps. FIG. 1e shows in cross-section the array 1 taken along the section line 1e—1e of the top view of FIG. 3. Specifically, a plurality of electrical contact pads 22, typically comprised of nickel, are deposited on the MWIR material 14 and the LWIR material 20 In order to make electrical contact to external readout electronics (not shown) a plurality of indium bumps 24 are formed in a conventional manner upon the contact pads 22. An electrically insulating layer of passivation 26 is provided over the surface of the device, the passivation 26 preferably being a semiconductor material selected to have a wider bandgap than the bandgaps of the layer 16 and the LWIR regions 20. A suitable material is CdTe. The passivation layer 26 functions to reduce surface recombination effects and other surface effect noise sources An additional electrical connection 28 is provided at an edge or edges of the device for electrically coupling to the common SWIR layer 16.

In this regard, and as is shown in the top view of the array 1 of FIG. 3 and in the elevational view of FIG. 4, contact to the SWIR "ground plane" layer 16 is typically made at a plurality of locations around the periphery of the array 1. The electrical conductivity of the common SWIR layer 16 may be further enhanced by including a vertical and/or horizontal contact metal grid structure (not shown) in the region between the LWIR regions 20. Such metalization reduces contact or sheet resistance across the layer 16 so as to minimize electrical crosstalk between individual ones of the photodetectors. If provided, the grid metalization is preferably formed before the deposition of the passivation layer 26.

A binary or analog lens array 30 may also be employed on or adjacent to the backside, or illuminated, surface of the substrate 10 in order to improve the fill factor of the detector array 1. A bandpass filter stack or stacks 32 can also be employed on or adjacent to the backside surface of the substrate 10 in order to pass only wavelengths within selected spectral regions.

As seen in FIG. 1e MWIR radiation, being indicated by $\lambda_1$, is absorbed in the MWIR material 14 while LWIR radiation, indicated by $\lambda_2$, passes through the MWIR and SWIR material and is absorbed within the LWIR region 20. Thus, during operation of the array 1 readout electronics (not shown) is enabled to simultaneously detect current modulated in accordance with the flux intensity of both LWIR and MWIR radiation.

Although the SWIR layer 16 forms heterojunctions 14a with the MWIR regions 14, it does not contribute significant numbers of SWIR photon-generated carriers since most SWIR radiation does not penetrate through the MWIR material In this regard the filter 32 may be used at the radiation admitting backside surface of the substrate 10 to eliminate any SWIR-related response in the MWIR material 14. As a result junction 14a is responsive to substantially only MWIR radiation. The LWIR region 20 is provided with a thickness great enough to absorb a significant quantity of the LWIR radiation that penetrates the underlying MWIR material 14 and the SWIR layer 16 As a result the heterojunctions 20a formed between SWIR layer 16 and the LWIR regions 20 are responsive substantially only to LWIR radiation.

The device described thus far shows the use of the wells 12 for containing the MWIR material 14. It should be realized that other fabrication techniques are also within the scope of the invention, specifically fabrication techniques that form the MWIR material 14 upon the substrate 10 surface.

FIG. 2a shows a continuous MWIR layer 14' that is deposited over the substrate 10 and subsequently patterned, such as by a conventional mesa etch technique, into upstanding MWIR structures 14, as indicated in FIG. 2c. The epitaxial SWIR layer 16 is then uniformly deposited over the surface of the substrate 10 and the upstanding MWIR regions 14. The thickness of the MWIR layer 14' is comparable to the depth of the MWIR material deposited within one of the wells 12; for example, 10 micrometers.

FIG. 2b shows an alternate technique wherein the surface of the substrate 10 is masked for permitting deposition of the MWIR material 14 only at the desired locations. After selectively depositing the MWIR material 14 the mask is removed and processing proceeds to FIG. 2c where the SWIR layer 16 is deposited.

Subsequent to the fabrication step shown in FIG. 2c further processing would occur as in FIGS. 1d and 1e for providing the LWIR regions 20 and the other structure illustrated.

The method of the invention has been described above in the context of a presently preferred embodiment of a back-side illuminated semiconductor radiation detector comprised of $Hg_{(1.0-x)}Cd_xTe$. It should be realized however that the invention can be practiced with radiation detectors comprised of other Group II-VI materials. The invention can also be practiced to fabricate detectors comprised of Group III-V materials such as GaAs, GaAlAs and InP and also with Group IV materials, such as Si and Ge, and with Group IV-VI materials such as PbSnTe and PbSSe. The invention can also be practiced to fabricate detectors having arrangements of radiation selective material other than the MWIR/SWIR/LWIR depicted, such as SWIR/SWIR/MWIR, MWIR/MWIR/LWIR and LWIR/MWIR/VLWIR. In general, the arrangement of photoresponsive material is such that incident radiation first encounters the shorter wavelength absorbing regions or layers 14 and 16. The longer wavelength radiation passes through these regions and into the region 20 where a significant portion of longer wavelength radiation is absorbed. The intervening common contact layer 16 may or may not substantially overlap the coverage of the region 14. The common contact layer may exhibit a slightly longer or a slightly shorter spectral cut-off than the region 14. By example, for a MWIR/MWIR/LWIR configuration for detecting radiation within the spectral bands of 3-5 micrometers and 8-12 micrometers the regions 14 have a spectral cut-off of five micrometers, the common contact layer 16 a spectral cut-off of eight micrometers, and the region 20 a spectral cut-off of 12 micrometers.

Thus, while the invention has been particularly shown and described with respect to preferred embodiments thereof, it will be understood by those skilled in the art that changes in form and details may be made therein without departing from the scope and spirit of the invention.

What is claimed is:

1. A method of fabricating an array of semiconductor radiation detectors, comprising the steps of:
    providing a substrate;
    selectively forming a plurality of first regions adjacent to a surface of the substrate, the first regions being comprised of a first semiconductor material having a first type of electrical conductivity and a significant responsivity to electromagnetic radiation having wavelengths within a first spectral band;
    forming an electrically conductive layer comprised of a second semiconductor material over an exposed area of the surface of the substrate and over the plurality of first regions, the layer being comprised of semiconductor material having a second type of electrical conductivity for forming a plurality of first heterojunctions with the underlying first regions; and
    selectively forming a plurality of second regions upon the layer, individual ones of the second regions being in registration with and disposed above a corresponding one of the first regions, the second regions being comprised of a third semiconductor material having the first type of electrical conductivity for forming a plurality of second heterojunctions with the underlying layer, the third semiconductor material further having a significant responsivity to electromagnetic radiation having wavelengths within a second spectral band that does not significantly overlap the first spectral band.

2. A method as set forth in claim 1 wherein the step of selectively forming a plurality of first regions adjacent to the surface of the substrate includes the steps of:
    forming a plurality of wells within the surface of the substrate; and
    filling the wells with the first semiconductor material, individual ones of the filled wells corresponding to individuals ones of the first regions.

3. A method as set forth in claim 2 wherein the step of forming an electrically conductive layer includes a step of depositing a substantially planar layer comprised of the second semiconductor material.

4. A method as set forth in claim 1 wherein the step of selectively forming a plurality of first regions adjacent to the surface of the substrate includes the steps of:
    applying a mask to the surface of the substrate, the mask having a plurality of openings made therethrough;
    selectively depositing the first semiconductor material within the openings within the mask; and
    removing the mask to leave upstanding portions of the first semiconductor material upon the surface of the substrate, individual ones of the upstanding portions corresponding to individuals ones of the first regions 5. A method as set forth in claim 1 wherein the step of selectively forming a plurality of first regions adjacent to the surface of the substrate includes the steps of:
    depositing a substantially planar layer comprised of the first semiconductor material over the surface of the substrate; and
    selectively removing a quantity of the substantially planar layer to leave upstanding portions thereof, individual ones of the upstanding portions corresponding to individuals ones of the first regions.

6. A method as set forth in claim 1 wherein the step of selectively forming the plurality of second regions includes the steps of:
    applying a mask to an upper surface of the layer, the mask having a plurality of openings made therethrough;
    selectively depositing the third semiconductor material within the openings within the mask; and
    removing the mask to leave upstanding portions of the third semiconductor material upon the surface of the layer, individual ones of the upstanding portions corresponding to individuals ones of the second regions.

7. A method as set forth in claim 1 wherein the step of selectively forming a plurality of second regions upon the layer includes the steps of:
    depositing a second layer comprised of the third semiconductor material over the electrically conductive layer; and
    selectively removing a quantity of the second layer to leave portions thereof, individual ones of the portions corresponding to individuals ones of the second regions.

8. A method as set forth in claim 1 and further comprising a step of forming an electrically conductive contact individually to each of the first regions and to each of the second regions.

9. A method as set forth in claim 1 and further comprising a step of forming one or more electrically conductive contacts to the electrically conductive layer.

10. A method as set forth in claim 1 and further comprising a step of forming a passivation layer over the layer and the second regions.

11. A method as set forth in claim 1 wherein the steps of selectively forming a plurality of first regions, forming an electrically conductive layer, and selectively forming a plurality of second regions each include a step of depositing a semiconductor alloy comprised of Group II-VI material.

12. A method as set forth in claim 1 wherein the steps of selectively forming a plurality of first regions, forming an electrically conductive layer, and selectively forming a plurality of second regions each include a step of epitaxially depositing Hg wherein the value of x is selected for providing a significant responsivity to wavelengths within the associated spectral band.

13. An array of radiation detectors each of which is responsive to electromagnetic radiation within a plurality of spectral bands, comprising:
    a substrate having first and second opposed major surfaces;
    a plurality of first regions disposed adjacent to the first surface of the substrate, each of the first regions being comprised of a first semiconductor material having a first type of electrical conductivity and having a significant responsivity to electromagnetic radiation having wavelengths within a first spectral band;

an electrically conductive layer comprised of a second semiconductor material overlying an exposed area of the first surface of the substrate and also overlying the plurality of first regions, the layer being comprised of semiconductor material having a second type of electrical conductivity for forming a plurality of first heterojunctions with the underlying first regions, the second semiconductor material having a significant responsivity to electromagnetic radiation having wavelengths within a second spectral band that may or may not significantly overlap the first spectral band; and a plurality of second regions overlying the layer, individual ones of the second regions being in registration with and disposed above a corresponding one of the first regions, the second regions being comprised of a third semiconductor material having the first type of electrical conductivity for forming a plurality of second heterojunctions with the underlying layer, the third semiconductor material further having a significant responsivity to electromagnetic radiation having wavelengths within a third spectral band that does not significantly overlap either the first or the second spectral bands.

14. An array as set forth in claim 13 wherein the substrate is comprised of a material selected to be substantially transparent to wavelengths within the spectral bands to which the first and the second regions have a significant responsivity.

15. An array as set forth in claim 14 wherein the substrate is comprised of CdZnTe.

16. An array as set forth in claim 13 wherein the plurality of first regions, the electrically conductive layer, and the plurality of second regions are each comprised of epitaxially grown $Hg_{l-x}Cd_xTe$, wherein the value of x is selected for providing a significant responsivity to wavelengths within the associated spectral band.

17. An array as set forth in claim 13 and further comprising a plurality of electrically conductive contacts individual ones of which are electrically coupled to individual ones of the plurality of first regions and second regions 18. An array as set forth in claim 13 and further comprising a passivation layer overlying exposed portions of the electrically conductive layer and exposed portions of the second regions.

19. An array as set forth in claim 18 wherein the passivation layer is comprised of a semiconductor material having a bandgap that is wider than a bandgap of the electrically conductive layer and a bandgap of the second regions.

20. An array as set forth in claim 13 and further comprising means, disposed adjacent to the second surface of the substrate, for concentrating radiation incident thereon upon the first regions.

21. An array as set forth in claim 13 and further comprising means, disposed adjacent to the second surface of the substrate, for selectively passing only predetermined spectral bands of radiation to the second surface.

* * * * *

UNITED STATES PATENT AND TRADEMARK OFFICE
CERTIFICATE OF CORRECTION

PATENT NO. : 5,149,956
DATED : 09/22/92
INVENTOR(S) : Paul R. Norton, Santa Barbara, Calif.

It is certified that error appears in the above-identified patent and that said Letters Patent is hereby corrected as shown below:

Column 8,

In the claims, claim 12, line 56, should read "$Hg_{1-x}Cd_xTe$", instead of "Hg".

Signed and Sealed this

Twenty-second Day of March, 1994

*Attest:*

BRUCE LEHMAN

*Attesting Officer*   *Commissioner of Patents and Trademarks*